United States Patent
Lee et al.

(10) Patent No.: US 6,706,646 B1
(45) Date of Patent: Mar. 16, 2004

(54) SPIN-ON GLASS COMPOSITION AND METHOD OF FORMING SILICON OXIDE LAYER IN SEMICONDUCTOR MANUFACTURING PROCESS USING THE SAME

(75) Inventors: Jung-Ho Lee, Suwon (KR); Jung-Sik Choi, Sungnam (KR); Hong-Ki Kim, Seoul (KR); Dong-Jun Lee, Kyungki-do (KR); Dae-Won Kang, Seoul (KR); Sang-Mun Chon, Seongnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 19 days.

(21) Appl. No.: 09/686,624

(22) Filed: Oct. 12, 2000

(30) Foreign Application Priority Data

May 2, 2000 (KR) .................... 10-2000-23448

(51) Int. Cl.⁷ .................... H01L 21/31; H01L 21/469
(52) U.S. Cl. .................... 438/782; 438/787; 438/790
(58) Field of Search .................... 438/758, 760, 438/765, 781, 782, 787, 790; 257/E23.118, E23.192, E21.241, E21.194; 427/10

(56) References Cited

U.S. PATENT DOCUMENTS

| 4,937,304 A | 6/1990 | Ayama et al. | |
| 4,950,381 A | 8/1990 | Takeuchi et al. | |
| 5,436,398 A | 7/1995 | Shimizu et al. | |
| 5,494,978 A | 2/1996 | Shimizu et al. | |
| 5,614,271 A | 3/1997 | Shibuya et al. | 427/541 |
| 5,665,643 A | 9/1997 | Shin | 438/763 |
| 5,738,911 A | * 4/1998 | Imamura et al. | 427/387 |
| 5,770,260 A | 6/1998 | Fukuyama et al. | |
| 5,905,130 A | 5/1999 | Nakahara et al. | |
| 5,907,382 A | * 5/1999 | Kajiura et al. | 349/158 |
| 5,922,411 A | 7/1999 | Shimizu et al. | 427/397 |
| 5,974,666 A | * 11/1999 | Tanaka et al. | 29/895.32 |
| 5,976,618 A | 11/1999 | Fukuyama et al. | 427/226 |
| 5,989,945 A | 11/1999 | Yudasaka et al. | |
| 6,133,137 A | 10/2000 | Usami | |
| 6,187,662 B1 | 2/2001 | Usami et al. | |
| 6,235,620 B1 | 5/2001 | Saito et al. | |
| 6,261,883 B1 | 7/2001 | Koubuchi et al. | |
| 6,338,868 B1 | * 1/2002 | Shibuya et al. | 427/10 |

FOREIGN PATENT DOCUMENTS

| EP | 266918 | 5/1988 |
| EP | 296433 | 12/1988 |
| EP | 315953 | 5/1989 |
| EP | 552852 | 7/1993 |
| EP | 0611067 | 8/1994 |
| EP | 749155 | 12/1996 |
| EP | 825231 | 2/1998 |
| EP | 1002824 | 5/2000 |
| JP | 11-145286 | 5/1999 |
| JP | 2000-58646 | 2/2000 |

* cited by examiner

Primary Examiner—W. David Coleman
Assistant Examiner—Khiem D Nguyen
(74) Attorney, Agent, or Firm—Lee & Sterba, P.C.

(57) ABSTRACT

A spin-on glass (SOG) composition and a method of forming a silicon oxide layer utilizing the SOG composition are disclosed. The method includes coating on a semiconductor substrate having a surface discontinuity, an SOG composition containing perhydropolysilazane having a compound of the formula —(SiH$_2$NH)$_n$— wherein n represents a positive integer, a weight average molecular weight within the range of about 4,000 to 8,000, and a molecular weight dispersion within the range of about 3.0 to 4.0, to form a planar SOG layer. The SOG layer is converted to a silicon oxide layer with a planar surface by curing the SOG layer. Also disclosed is a semiconductor device made by the method.

6 Claims, 12 Drawing Sheets

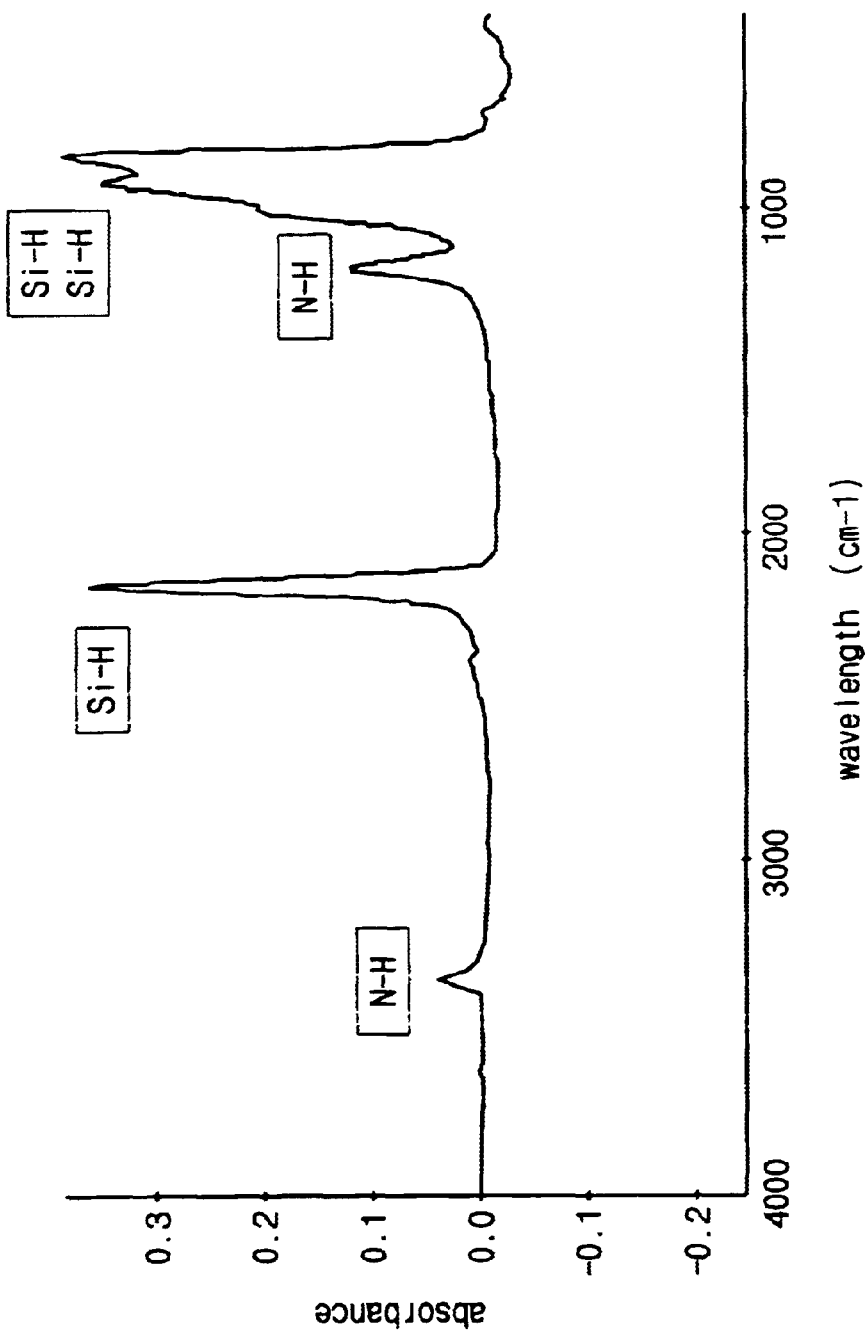

SPIN-ON GLASS COMPOSITION AND METHOD OF FORMING SILICON OXIDE LAYER IN SEMICONDUCTOR MANUFACTURING PROCESS USING THE SAME

BACKGROUND OF THE INVENTION

1. Field of the Invention

The present invention relates to a spin-on glass (SOG) composition useful in forming a silicon oxide layer in a semiconductor manufacturing process, to a semiconductor device made thereby, and to a method of forming a silicon oxide layer using the same. More particularly, the present invention relates to a spin-on glass composition containing perhydropolysilazane, and its use in forming a silicon oxide layer in a semiconductor device.

2. Description of the Related Art

The design of semiconductor devices have recently made rapid progress. In particular, this progress has required semiconductor devices to function with high operating speed, and to have a large storage capacitance. In order to satisfy such requirements, semiconductor devices with increased density, reliability, and response time are under development.

Integrated circuits typically are manufactured by forming a large number of active devices on a single substrate. After each device is formed and insulated, some of the devices are electrically interconnected during the manufacturing process to accomplish a desirable circuit function. Metal Oxide Semiconductor (MOS) and bipolar VLSI and ULSI devices, for example, have multilevel interconnection structures in which a large number of devices are interconnected. In such a multilevel interconnection structure, the topography of the top layer usually is increasingly irregular and uneven as the number of layers increases.

For example, a semiconductor wafer with two or more metal layers typically is formed as follows. A number of oxide layers, a polycrystalline silicon conductive layer, and a first metal wiring layer are formed on a semiconductor wafer. A first insulation layer then is formed on the resulting structure. Then, a via hole is formed for providing circuit paths to a second metal layer. At this time, the surface of the first insulation layer is uneven because the layers underlying the first insulation layer are uneven. When the second metal layer is directly formed on the first insulation layer, the second metal layer may fracture due to protrusions or cracks in the underlying insulation layer. In addition, there may be a decreased yield of the semiconductor device if the deposition state of the metal layer is poor. Accordingly, the insulation layer typically is planarized before formation of the via hole or the second metal layer that will be formed in a multilevel metal interconnection structure to offset the effects of a varied wafer topography.

Various methods have been developed to planarize the insulation layer. These methods include utilizing a borophosphorous silicate glass (BPSG) layer, which has good reflow characteristic, or an SOG layer and a chemical mechanical polishing (CMP) method. In general, BPSG is widely utilized as an insulation layer material to fill gaps between metal wirings. However, depositing BPSG presents problems because it depends primarily on establishing special deposition parameters for the equipment utilized. In addition, the gases used in the process are expensive and severely toxic.

Furthermore, as the packing density increases and the design rule gradually decreases for manufacturing VLSI having 256 megabits or more, using BPSG as the insulation layer to fill gaps between wirings lowers the yield due to the occurrence of voids and bridges. In addition, an etch stop layer may possibly be damaged during its subsequent formation. Thus, the prior art typically implements a reflowing process and an expensive CMP process to solve these problems.

An insulation layer formed by an SOG layer is known as being manufactured by a simple coating process. This process produces a planar insulation layer. For example, U.S. Pat. No. 5,310,720 (issued to Shin et al.) discloses a method for making a silicon oxide layer. A polysilazane layer is formed, and then the polysilazane layer is heated in an oxygen atmosphere to convert it into a silicon oxide layer. U.S. Pat. No. 5,976,618 (issued to Shunichi Fukuyama et al.) discloses a method in which an inorganic SOG is deposited, and then two step heat treatment processes are implemented to convert the SOG layer into a silicon oxide layer.

The basic backbone structure of polysilazane-based SOG is composed of Si—N. Si—H and N—H bonds. The Si—N bonds are converted into (or substituted with) Si—O bonds by baking under an atmosphere including oxygen and water. A simple spin coating and a simple curing process are performed to convert the SOG layer into the silicon oxide layer. Accordingly, it is an economical method.

However, not all of the Si—N bonds are converted to Si—O bonds (see, for example. Japanese Patent Laid-Open No. Hei 11-145286). Accordingly, the silicon oxide layer has different insulating and electrical characteristics when compared to a pure silicon oxide layer such as one formed using a BPSG layer or a TEOS layer. For these reasons, many have avoided using the conventional SOG layer and then converting it into a silicon oxide insulation layer. In addition, because SOG is deposited by a spin coating method, the thickness of the thus formed silicon oxide layer is not sufficient. This provides insufficient coverage for the conductive layers, such as gate electrodes and metal wirings.

SUMMARY OF THE INVENTION

Accordingly, it is a feature of an embodiment of the present invention to provide a spin-on glass composition that fills gaps between closely-spaced metal wirings of semiconductor devices having a high packing density and a large aspect ratio. It is also a feature of the present invention to provide a composition that fills gaps or smoothes surface discontinuities on a substrate without the need for mechanical planarization. It also is a feature of the invention to provide a spin-on glass composition that has substantially the same characteristics as an oxide layer of a semiconductor device formed by a chemical vapor deposition (CVD) method. It is another feature of the invention to provide a method of forming an oxide layer in a semiconductor manufacturing process using the above spin-on glass composition.

In accordance with these and other features of the invention, there is provided a spin-on glass composition and device made therewith containing perhydropolysilazane having the formula —$(Si_2NH)_n$— wherein n represents a positive integer, in an amount of about 10 to about 30% by weight based on the total weight of the composition, whereby the perhydropolysilazane has a weight average molecular weight within the range of about 4,000 to about 8,000, and a molecular weight dispersion within the range of about 3.0 to about 4.0. The spin-on glass composition of the invention also includes a solvent in an amount of about 70% to about 90% by weight, based on the total weight of the composition.

In accordance with another feature of the invention, there is provided a method of forming a silicon oxide layer on a semiconductor substrate having a stepped portion or surface discontinuities. The method entails coating on the semiconductor substrate a spin-on glass composition containing the compound perhydropolysilazane having the chemical formula —(SiH$_2$NH)$_n$— wherein n represents a positive integer, a weight average molecular weight within the range of about 4,000 to 8,000, and a molecular weight dispersion within the range of about 3.0 to 4.0, thereby forming a planar SOG (spin-on glass) layer. Finally, the SOG layer is cured to form a silicon oxide layer having a planar surface. The invention further includes a semiconductor device made by the aforementioned method.

According to various embodiments of the present invention, a uniform silicon oxide layer having substantially no voids can be formed by utilizing an SOG composition that completely covers a conductive layer having an aspect ratio of about 5:1 to 10:1 or other surface discontinuities.

BRIEF DESCRIPTION OF THE DRAWINGS

The above features and advantages of the present invention will become more apparent by describing in detail preferred embodiments thereof with reference to the attached drawings in which:

FIG. 3 is a Fourier Transform infrared spectroscopy (FT-IR) diagram showing light absorbance of a layer detected after pre-baking an SOG layer.

DESCRIPTION OF ILLUSTRATIVE EMBODIMENTS

Figure 1:
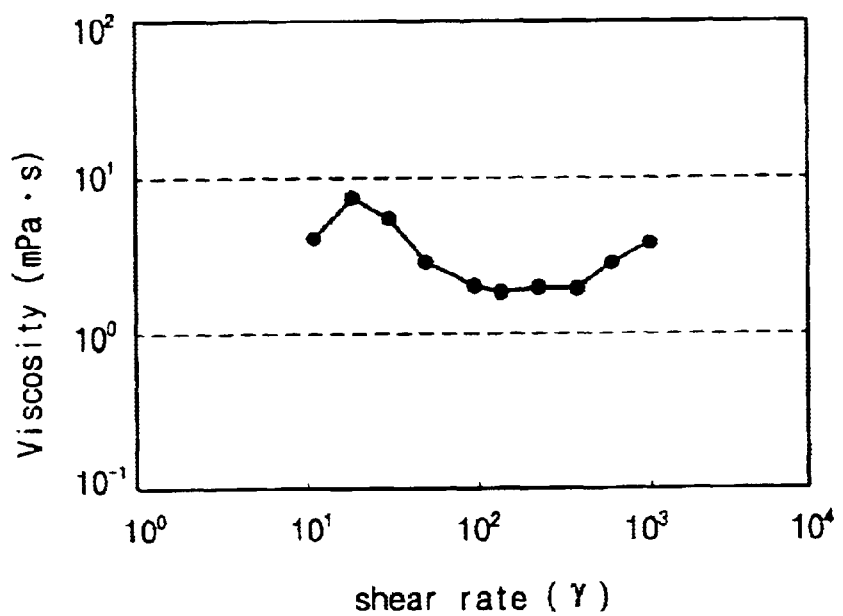
FIG. 1 is a graph illustrating the relationship between viscosity and shear rite of an SOG composition of the present invention.

Korean Patent Application No. 2000-23448, filed on May 2, 2000 and entitled: "Spin-On Glass Composition and Method of Forming Silicon oxide Layer in Semiconductor Manufacturing Process Using the Same," is incorporated by reference herein in its entirety. The present invention now will be explained in more detail with reference to the attached drawings.

Whenever it is stated that a material, layer, or structure is formed or deposited on or over another material, structure, or layer; another layer, material, or structure may be intervening.

The spin-on glass composition of the present invention contains perhydropolysilazane having the formula —(Si$_2$NH)$_n$— wherein n represents a positive integer, a weight average molecular weight within the range of about 4,000 to 8,000, and a molecular weight dispersion within the range of about 3.0 to 4.0. Throughout this description, the expression "molecular weight dispersion" denotes the ratio of weight average molecular weight to number average molecular weight.

Methods of making polysilazane are widely known. By one typical method, polysilazane is prepared by reacting halosilane with a Lewis base to obtain a complex compound and then reacting the complex compound with ammonia. Polysilazane also can be prepared by: (i) reacting a silicone halide such as SiCl$_4$ or SiH$_2$Cl$_2$ with amine; (ii) converting silazane into polysilazane utilizing an alkaline metal halide catalyst; (iii) dehydrogenating from a silane compound utilizing a transition complex metal compound and an amine compound; or the like.

U.S. Pat. No. 5,494,978 (issued to Yasuo Shinizu et al.) discloses a method of preparing a defoamed polysilazane utilizing inorganic polysilazane having a number average molecular weight of 100–100,000. U.S. Pat. No. 5,905,130 (issued to Hirohiko Nakahara et al.) discloses a method of preparing polysilazane by reacting a polyaminosilane compound with a polyhydrogenated nitrogen-containing compound in the presence of a base catalyst, or by reacting a polyhydrogenated silicone compound with a polyhydrogenated nitrogen-containing compound under a basic solid oxide catalyst. U.S. Pat. No. 5,436,398 (issued to Yasuo Shimizu et al.) discloses a method of preparing perhydropolysilazane having a number average molecular weight of about 1,120. U.S. Pat. No. 4,937,304 (issued to Ayama et al.) and U.S. Pat. No. 4,950,381 (issued to Takeuchi et al.) disclose methods for preparing polysilazanes having desired molecular weights. The disclosures of each of the aforementioned documents are incorporated by reference herein in their entirety.

The perhydropolysilazane utilized in the present invention can be prepared by any of the methods described above without limitation. In order to be used in various embodiments of the present invention, perhydropolysilazane prepared by the above methods preferably is fractionated according to its molecular weight. When the weight average molecular weight is below about 4,000, the outgassing amount may be increased, and the perhydropolysilazane may be converted into silicon oxide too rapidly which can generate cracks due to the low molecular weight. On the other hand, when the weight average molecular weight exceeds 8,000, the viscosity of the SOG solution may increase, which deteriorates the uniformity of the thus formed SOG layer. Accordingly, the weight average molecular weight of perhydropolysilazane used in the present invention preferably is in the range of about 4,000 to 8,000. More specifically, the weight average molecular weight of the perhydropolysilazne is 6000–8000 preferably 6500–7000, when the SOG layer is formed to fill trenches (gaps); the weight average molecular weight of the perhydropolysilazne is 4000–6000 preferably 4500–5000, when the SOG layer is formed to planarize gate electrodes; and the weight average molecular weight of the perhydropolysilazne is 4500–7500 when the SOG layer is formed to planarize metal patterns.

In addition, when the molecular weight dispersion of polysilazane, which is the ratio of weight average molecular weight to number average molecular weight, is below 3.0, the fractionation efficiency of perhydropolysilazane and the yield of fractionated perhydropolysilazane may below. On the other hand, when the molecular weight dispersion exceeds 4.0, the converted silicon oxide layer may not be uniform. Accordingly, the molecular weight dispersion of perhydropolysilazane useful in the invention preferably is within the range of about 3.0 to 4.0, although conditions may exist for utility of the composition outside of this range.

An SOG composition preferably is an SOG solution prepared by dissolving the aforementioned perhydropolysilazane in a solvent, preferably an organic solvent. Any of a variety of organic or other solvents may be used in the present invention without limitation. Useful solvents preferably include an aromatic solvent, such as xylene, or an ether solvent, such as dibutyl ether. When the amount of perhydropolysilazane in the SOG solution exceeds 30% by weight, the perhydropolysilazane may, but not necessarily, have increased instability, the lifetime of the solution may decrease, and cracks may be formed. When the amount of perhydropolysilazane in the SOG solution is below 10% by weight, it may, but not necessarily, become difficult to control the thickness of the SOG layer. Accordingly, the amount of perhydropolysilazane in the SOG solution is preferably within the range of 1 to 30% by weight based on the total weight of the composition, and more preferably, the amount is within the range of 18 to 25% by weight. It also is preferred that the solvent in the SOG solution be within the range of 70 to 90% by weight based on the total weight of the composition, and more preferably, within the range of 75 to 82% by weight.

The preferred contact angle of the SOG composition with an underlying layer, such as a silicon nitride layer, preferably is no more than 4°. The adhesion of the SOG composition with the underlying layer may be insufficient when the contact angle exceeds 4°.

To achieve surface uniformity during the coating and curing process, the SOG solution preferably has a viscosity within the range of about 1 to 10 mPa·s, and more preferably, within the range of 1 to 8 mPa·s, at a predetermined shear rate. FIG. 1 is a graph illustrating the relationship between viscosity and shear rate of the SOG solution. In the graph of FIG. 1, the ordinate represents the viscosity (mPa·s), and the abscissa represents the shear rate (1/s). The viscosity of the SOG solution according to the present invention preferably is within the range of about 1 to 10 mPa·s, at a shear rate of 54–420 (1/s), as shown in FIG. 1. It also can be seen from FIG. 1 that the viscosity of the SOG composition may be within the range of about 1 to about 10 mPa·s, at a shear rate within the range of 10 to 1,000 (1/s).

The SOG solution may include at least one impurity material selected from boron, fluorine, phosphor, arsenic, carbon, oxygen, and mixtures thereof, as the occasion needs. When at least an impurity selected from boron, fluorine, phosphor, and arsenic is included in the SOG solution among the impurity materials, a silicon oxide layer converted from the SOG solution will include the impurity material, and the layer may have characteristics similar to a conventional boron silicate glass (BSG) layer, BPSG layer, phosphorous silicate glass (PSG) layer, or the like. Conversion of SOG into a silicon oxide layer may be promoted when at least one of carbon and/or oxygen is included in the SOG solution as an impurity.

The SOG solution preferably is coated by a spin coating method onto a semiconductor substrate having stepped portions, such as conductive line patterns. This method is particularly useful in forming a planar SOG layer.

The stepped portions on the semiconductor substrate may result from conductive patterns. For example, conductive metal wiring patterns, such as gate electrode patterns or bit lines, result in stepped portions on the surface of the substrate. The distance between the two conductive patterns is not limited. In general, however, when the distance is greater than 1 μm, conventional methods of forming an oxide layer utilizing BPSG are adequate, but when the distance approaches 0.04 μm, for example, the method utilizing the SOG solution of the present invention others greater possibilities of void filling. Accordingly, the method of the present invention preferably is applied to a semiconductor substrate having gaps of about 0.04–1 μm.

The method of various embodiments of the present invention may also be applied to conductive pattern gaps of low aspect ratio (whereby the aspect ratio represents the ratio of the depth with respect to the distance of the gap). However, a conductive pattern having an aspect ratio of about 5:1 to about 10:1 preferably is applied in various embodiments of the invention.

Generally, closely spaced gaps in which conductive patterns are closely formed, such as a cell array region including gate electrodes, can be formed on a semiconductor substrate. In addition a global stepped portion in which conductive patterns are sparsely formed, such as a peripheral circuit region, also can be formed on a semiconductor substrate. The present invention can be applied to a semiconductor substrate having closely spaced gaps with an aspect ratio within the range of from about 5:1 to about 10:1, and sparsely spaced stepped portions with an aspect ratio of about 1:1 or less.

Stepped portions also result from prominence/recess portions of the semiconductor substrate. In particular, an oxide layer can be formed by the method of the present invention, whereby the layer preferably is formed on stepped portions of the semiconductor substrate having grooves and protrusions. Forming the oxide layer in this manner is useful for manufacturing an isolation region having a shallow trench isolation (STI) structure. In addition, stepped portions result from metal wirings formed on an insulation layer. That is, a silicon oxide layer formed by the method of the present invention can be utilized as an insulation interlayer for insulating metal wirings formed on the insulation layer.

Advantageously, the SOG layer formed by the above method can be cured to thereby convert it into a silicon oxide layer with a planar surface. The curing step is performed by pre-baking and main-baking. Based on the teachings herein, those skilled in the art are capable of curing the SOG layer, and converting it into a silicon oxide layer having a planar surface.

The pre-baking preferably is performed at a temperature within the range of about 100 to 500° C. for about 1–5 minutes. When the pre-baking temperature is below 100° C., organic solvent may possibly remain in the layer, and not be fully removed. On the other hand, when the pre-baking temperature is over 500° C., polysilazane at or below a certain depth may not be completely converted into silicon oxide at the subsequent main-baking procedure, and the surface portion may be rapidly converted into silicon oxide, which can generate cracks, thereby causing non-uniformity in a consequent silicon oxide layer.

When pre-baking is performed for less than one minute, organic solvents may remain in the layer, and not be fully removed. On the other hand, when pre-baking is performed for more than 5 minutes, a partial conversion into silicon oxide may occur at the surface of the SOG layer, thereby forming a partial crack even if the organic solvent was completely removed. Therefore, pre-baking preferably is performed at a temperature within the range of about 100 to 500° C., and for a period of time from about 1 to 5 minutes, and more preferably at a temperature within the range of 100 to 400° C., and for a period of time within the range of about 2 to 3 minutes.

The main baking preferably is conducted at a higher temperature and for a longer time, when compared to the pre-baking. The basic backbone structure of perhydropolysilazane-based SOG includes Si—N bonds. These Si—N bonds may be substituted with (or converted into) Si—O bonds by baking in an atmosphere including oxygen and water. According to conventional methods employing spin-on glass compositions described previously, not all of the Si—N bonds become substituted with Si—O bonds, and therefore, some Si—N bonds remain in the Si—O layer after coating the SOG solution and subsequent baking. In accordance with a method of present invention, however, no Si—N bonds remain after coating the SOG solution to form the SOG layer and implementing the curing process. Accordingly, the silicon oxide layer formed by various embodiments of the invention has substantially the same characteristics as a pure silicon oxide layer formed by conventional CVD methods.

The main baking preferably is conducted at a temperature within the range of about 400 to 1,200° C. When the main baking temperature is below 400° C., curing may not be sufficient, and some Si—N bonds may remain thereby deteriorating tile characteristics of the oxide layer. On the other hand, when the main baking temperature is over 1,200° C., the planarity of the thus formed silicon oxide layer may be lowered or cracks may occur. Therefore, main baking preferably is carried out at temperatures within a range of about 400 to 1,200° C., and more preferably, at temperatures within the range of about 400 to 1,000° C.

Furthermore, main baking preferably is conducted for a period of time ranging from about 10 to 180 minutes. When the main baking time is less than 10 minutes, the SOG layer may not be sufficiently converted into the silicon oxide layer. On the other hand, when the main-baking time exceeds 180 minutes, stress in the thus formed silicon oxide layer increases. Therefore, the main baking preferably is carried out for a period of time within the range of about 10 to 180 minutes, and more preferably within the range of 30 to 120 minutes.

The main baking preferably is carried out in an oxidizing atmosphere, or in an inert atmosphere that is appropriate for converting Si—N bonds into Si—O bonds. For example, useful environments for the main baking procedure include an atmosphere of oxygen, an atmosphere including water vapor, an atmosphere including a mixture of oxygen and water vapor, an atmosphere including nitrogen, and mixtures of these atmospheres. An atmosphere including water vapor is preferred, and it preferably contains from about 1.2 to about 86% by weight of water.

The temperature range of the main baking can be determined by considering its effect on an underlying structure. For example, when the underlying structure includes trenches formed by partially etching an upper portion of a semiconductor substrate and the SOG layer is formed to fill up the trenches, the preferred temperature range of the main baking of the curing process is within the range of about 900 to 1,000° C. When the underlying structure includes a plurality of gate electrodes formed on the semiconductor substrate and the SOG layer is formed to completely cover the gate electrodes, the preferred temperature range of the main baking is within the range of about 600 to 900° C. When the underlying structure includes a plurality of metal wiring patterns formed on an insulation layer disposed on the semiconductor substrate, and the SOG layer is formed to completely cover the metal wiring patterns, the preferred temperature range of the main baking is within the range of about 400 to 450° C. Those skilled in the art are capable of determining the appropriate temperature range for the main baking, using the guidelines provided herein. Thus the specific ranges of parameters set forth in this specification are not intended to limit the invention.

One coating of the SOG composition typically provides a silicon oxide layer having a thickness within the range of about 4,000 to 6,500 Å. Before coating the SOG composition, a silicon nitride layer having a thickness within the range of about 200 to 600 Å can be formed as an etch stop layer on the upper and side portion of the conductive patterns.

It should be noted that a semiconductor device manufactured (method of forming a silicon oxide layer) using the SOG composition of the present invention can be used to fill trenches, planarize gate electrodes and/or metal patterns. However, the SOG composition of the present may be used to only fill trenches and conventional SOG compositions or methods may be used to planarize gate electrodes and metal patterns, or in combination. In other words, it is possible to use the SOG composition of the present invention to fill trenches, planarize gate electrodes and metal patterns in a single semiconductor device, but not necessarily.

Aspects of the present invention now will be explained with reference to the following non-limiting examples.

EXAMPLES

Preparation of an SOG Composition

Perhydrpolyosilazane having a weight average molecular weight of 4,500–7,000 and a molecular weight dispersion of 3.0–4.0 was obtained by fractionating commercially available perhydropolysilazane. The fractionated perhydropolysilazane was dissolved in xylene to obtain an SOG composition having a perhydropolysilazane concentration of 22–25% by weight, based on the total weight of the composition. The contact angle of the SOG composition was 4° or less with respect to an underlying silicon nitride layer.

The viscosity of the SOG composition was detected according to the variation of its shear rate. The viscosity characteristic is illustrated in FIG. 1. FIG. 1 is a graph illustrating the viscosity change with respect to the shear rate change of the SOG solution. The ordinate represents the viscosity (mPa·s) and the abscissa represents the shear rate (1/s). As can be seen in FIG. 1, the SOG solution preferably has a uniform viscosity within the range of about 1 to 10 mPa·s, at a shear rate of about 10 to 1,000 (1/s), more preferably at a shear rate of about 54 to 420 (1/s).

Formation of Oxide Layers

Figure 2A:
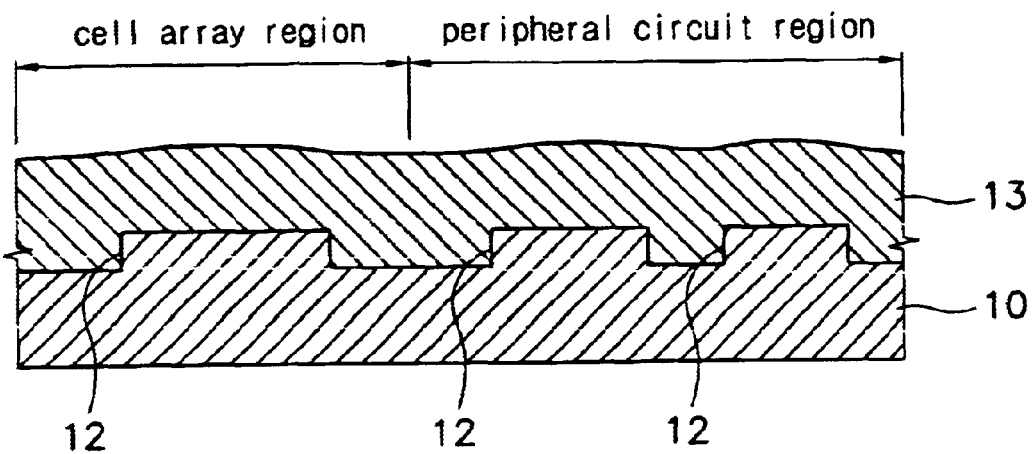
FIGS. 2A–2K are cross-sectional views illustrating a method of forming a silicon oxide layer in a semiconductor manufacturing process according to an embodiment of the invention.

FIGS. 2A–2K are cross-sectional views illustrating a method of forming a silicon oxide layer in a semiconductor manufacturing process according to an embodiment of the present invention. Referring to FIG. 2A, there is provided a p-type substrate 10 formed of a semiconductor material, such as silicon (Si). Trenches 12 were formed on the substrate 10 by etching an isolation region. The depth of trench 12 was about 4,600 Å, and the width thereof was about 1,250 Å. On the substrate 10 on which the trenches 12 were formed, the SOG solution containing perhydropolysilazane with a weight average molecular weight of 6,000–8,000 prepared as above was coated to a thickness of about 6,000 to 7,000 Å to form a first SOG layer 13.

Figure 2B:
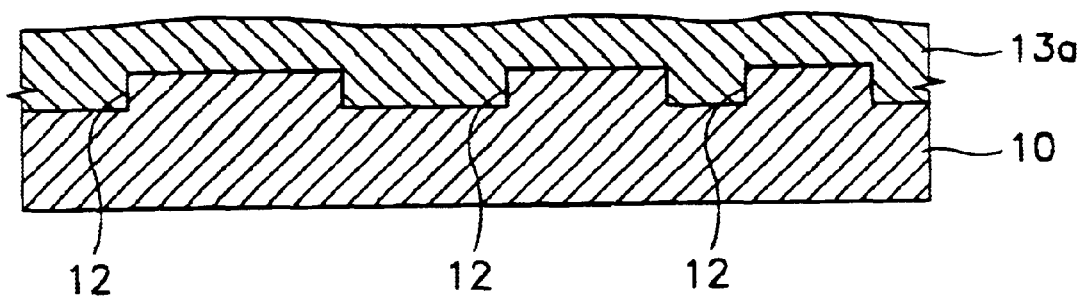
Figure 2C:
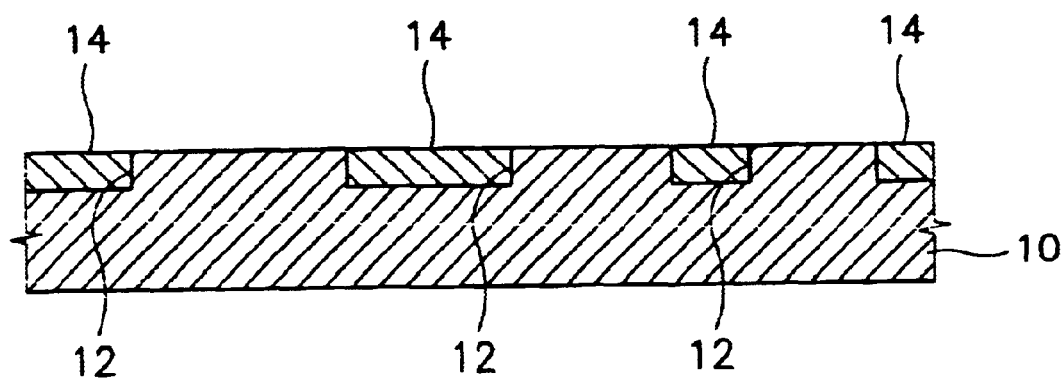

Referring now to FIG. 2B, the first SOG layer 13 was pre-baked at about 100 to 500° C. for 1–5 minutes, and then main-baked at about 900 to 1,000° C. for 30 minutes to convert the first SOG layer 13 into a first silicon oxide layer 13a. At this time, the baking was implemented under a water vapor atmosphere having a water content of about 86% by weight Referring to FIG. 2C, the silicon oxide layer 13a was polished by a CMP method until the upper surface of the semiconductor substrate 10 was exposed to form device isolation regions where the inside portions of trenches 12 were filled with silicon dioxide 14.

Figure 2D:
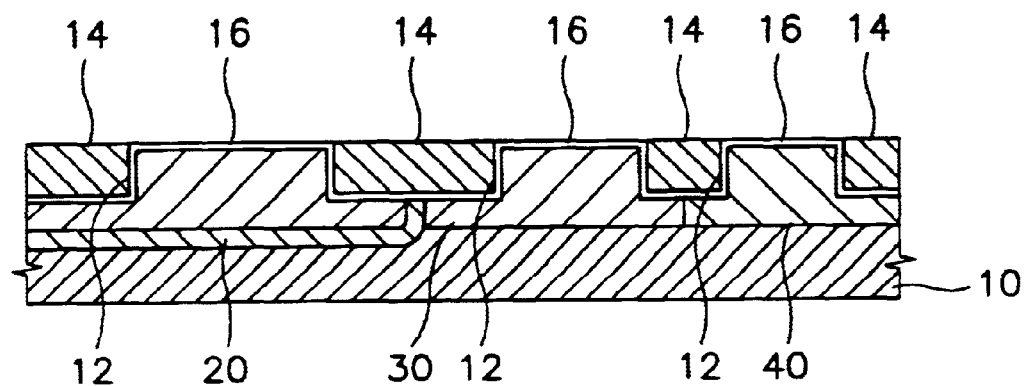

Referring to FIG. 2D, an n-type semiconductor region 20 was formed by doping an n-type impurity, such as phosphorous (P) ions, into a region for forming memory cells of the semiconductor substrate 10 (cell array region). In addition, a p-type well 30 was formed by doping a p-type impurity, such as boron (B) ions, into the cell array region and a portion of the peripheral circuit region. Finally, an n-type well 40 was formed by doping an n-type impurity, such as phosphorous (P) ions, into the remaining region of the peripheral circuit region.

Next, an impurity for controlling a threshold voltage, such as boron fluoride ($BF_2$) was doped into the p-type well 30 and the n-type well 40. Thereafter, each surface portion of the p-type well 30 and the n-type well 40 was cleaned utilizing a fluorine-based cleaning solution. The semiconductor substrate 10 then was wet oxidized to form a gate oxide layer 16 on each surface of the p-type well 30 and the n-type well 40. At this time, portions of the substrate within trenches 12 also were partially oxidized to from a continuous gate oxide layer 16. The thickness of the gate oxide layer 16 was about 40–200 Å.

Figure 2E:
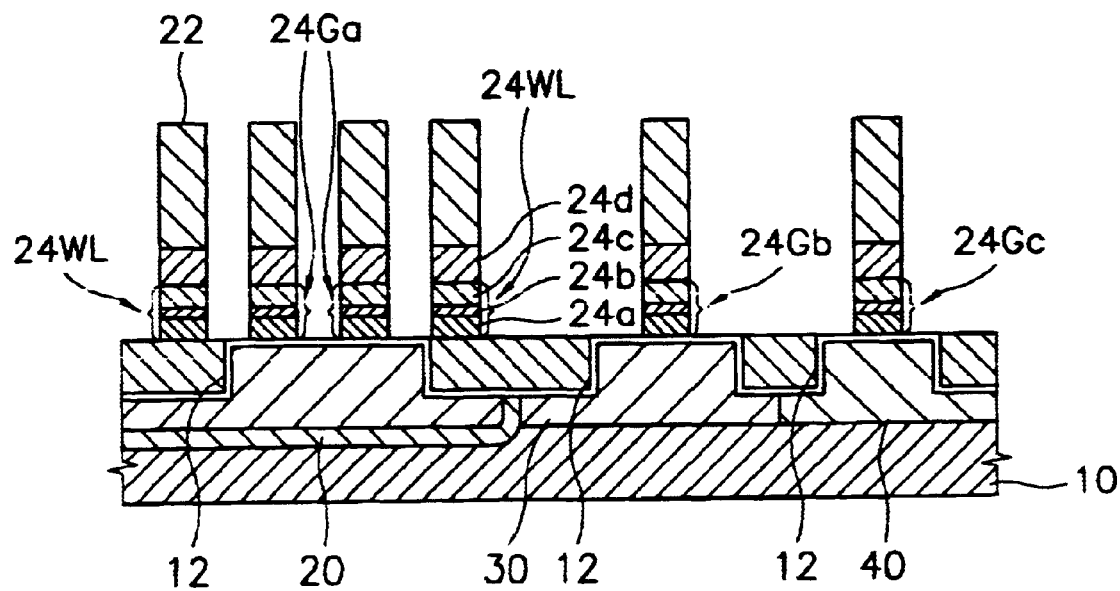

Referring to FIG. 2E, a polysilicon layer was formed on the substrate 10, in which the silicon oxide 14 that filled the trenches 12 as a field oxide, and gate oxide layer 16 were formed. The polysilicon layer had a thickness of about 500 to 4,000 Å, and was formed by depositing polycrystalline silicon doped with an n-type impurity, such as phosphorous (P) ions, by a low pressure chemical vapor deposition (LPCVD) method. Then, tungsten silicide and tungsten were deposited by a sputtering method on the polysilicon layer to form a tungsten silicide layer and a tungsten layer which had respective thicknesses of about 1,000 to 2,000 Å. A silicon nitride layer then was deposited on the tungsten layer. The silicon nitride layer was formed to have a thickness of about 500 to 2,000 Å by a LPCVD, or a plasma enhanced chemical vapor deposition (PECVD) method. Skilled artisans are capable of forming the respective layers, using the guidelines provided herein.

A photoresist film then was formed on the silicon nitride layer, and the photoresist film was selectively exposed by utilizing a mask. Then, the photoresist film was developed to form a photoresist pattern 22 for forming gate electrodes. The silicon nitride layer, tungsten layer, tungsten nitride layer, and polysilicon layer then were etched one by one by utilizing the photoresist pattern 22 as an etching mask to form gate electrodes 24G*a*, 24G*b*, 24G*c* and 24GWL composed of a polysilicon pattern 24*a*, a tungsten silicide pattern 24*b*, tungsten pattern 24*c*, and silicon nitride pattern 24*d*. Gate electrodes 24G*a* and word lines 24GWL were formed at the cell array region, and gate electrodes 24G*b* and 24G*c* were formed at the peripheral circuit region.

The gate electrodes 24G*a* and 24GWL formed on the cell array region were manufactured so that the gaps between the gate electrodes were in the range of about 0.4 to 1 $\mu$m. The aspect ratio, which is the ratio of the depth with respect to the gap width of gate electrodes 24G*a* and 24GWL, was within the range of about 5:1 to 10:1 thereby forming a closely stepped portion. On the other hand, the aspect ratio of the gate electrodes 24G*b* and 24G*c* formed on the peripheral circuit region, was less than 1:1 thereby forming a global stepped portion.

Figure 2F:
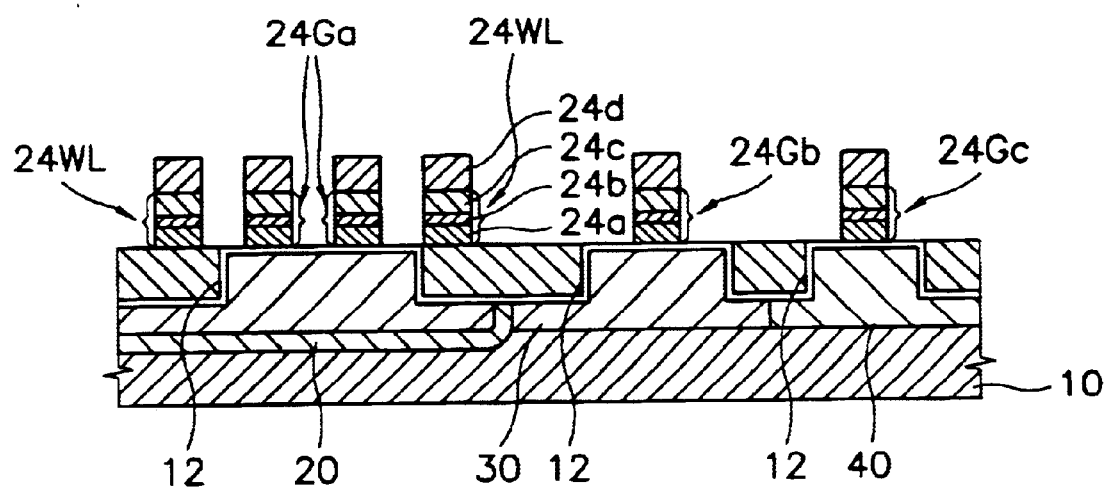
Figure 2G:
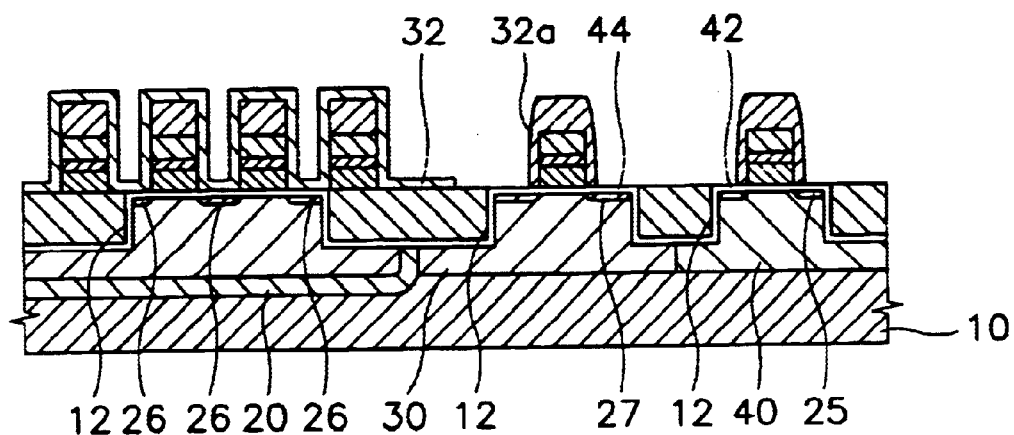

Referring to FIG. 2F, the photoresist pattern 22 was removed. In FIG. 2G, a p-type impurity doped region 25 was formed in the n-type well 40 at both sides of the gate electrode 24G*c* by doping a p-type impurity, such as boron ions, into the n-type well 20. Also, an n-type impurity doped region 27 was formed in the p-type well 30 at both sides of the gate electrode 24G*b* by doping an n-type impurity, such as phosphorous ions, into the p-type well 30. An n-type impurity doped region 26 was formed in the p-type well 20 at both sides of gate electrodes 24G*a*.

Referring to FIG. 2G, silicon nitride was deposited on the semiconductor substrate by a chemical vapor deposition method to form a silicon nitride layer 32 having a thickness of about 200–600 Å. Next, the silicon nitride layer 32 on the cell array region was covered with a photoresist film, and the silicon nitride layer 32 on the peripheral circuit region was anisotropically etched to form a spacer 32*a* on side walls of the gate electrodes 24G*b* and 24G*c* (Fib. 2F) of the peripheral circuit region.

Next, a p+-type impurity doped region (source, drain regions) was formed by doping a p-type impurity, such as boron ions, into the n-type well 40 of the peripheral circuit region. In addition, an n+-type impurity doped region (source, drain regions) was formed by doping an n-type impurity, such as arsenic (As) ions, into the p-type well 30 of the peripheral circuit region.

Figure 2H:
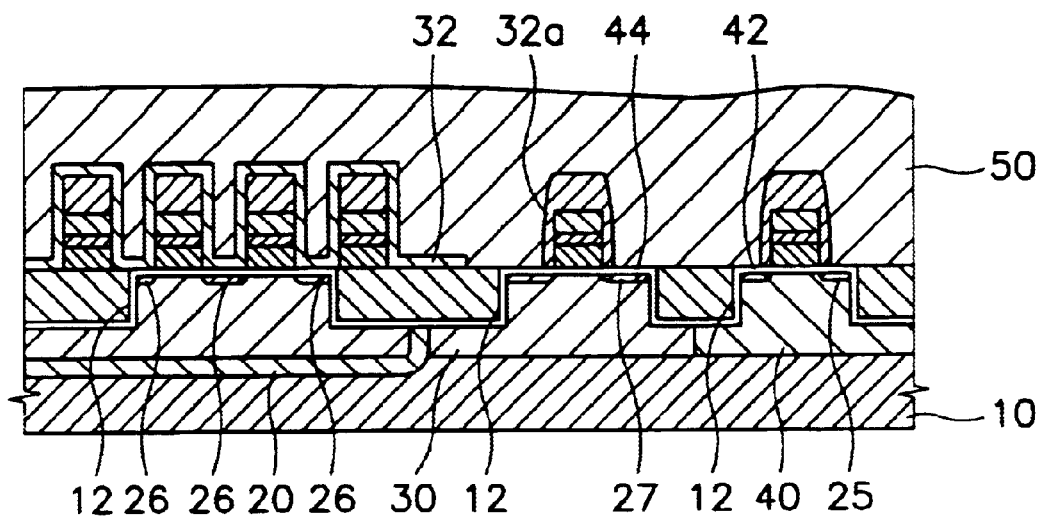

Referring to FIG. 2H, an SOG solution was coated on the semiconductor substrate 10 to form a second SOG layer 50. The second SOG layer 50 was formed by a spin coating method, whereby the rotational velocity of the water was about 500–2,500 rpm. The weight average molecular weight of the perhydropolysilazane was 4,000 to 6,000. The thickness of the second SOG layer 50 was in the range of about 7,500 to 8,200 Å. The second SOG layer 50 completely covered the gate electrodes 24G*a* 24G*b*, 24G*c* and 24GWL. Next, the second SOG layer 50 was pre-baked at a temperature within the range of about 100 to 500° C. for about 1 to 5 minutes, and then was main-baked at a temperature within the range of about 600 to 900° C. for about 10 to 180 minutes. The baking was conducted under at least one atmosphere selected from an oxygen atmosphere, a water vapor atmosphere, an atmosphere containing a mixture of oxygen and water vapor, a nitrogen atmosphere, or mixtures thereof. When the baking was implemented in a water vapor atmosphere, the water content in the atmosphere was controlled to be within the range of about 1.2–86% by weight.

Figure 2I:
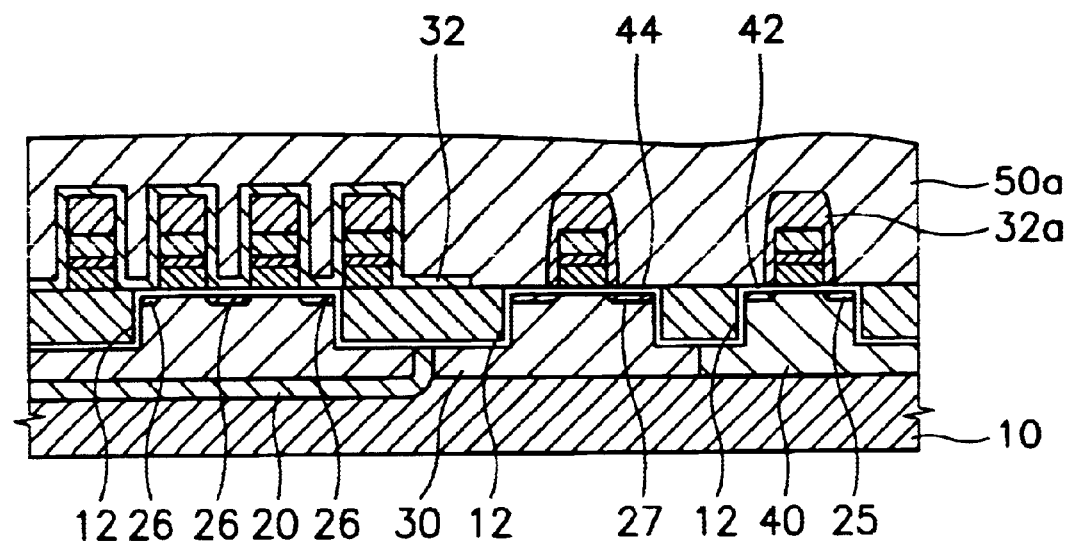

During the curing process, Si—N bonds in the second SOG layer 50 were substituted with Si—O bonds to convert the second SOG layer 50 into a silicon oxide layer 50*a*. The thickness of second silicon oxide layer 50*a* decreased by about 19–20% of the thickness of second SOG layer 50 during this process, as shown in FIG. 2I.

Figure 2J:
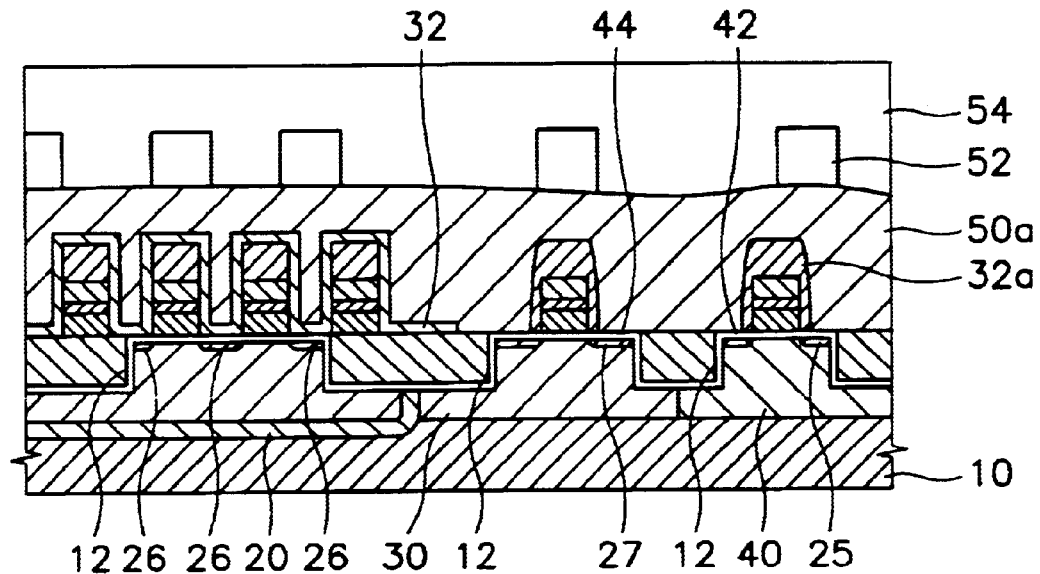

Referring to FIG. 2J, a metal layer with a thickness of about 5,000 Å was formed by depositing a metal such as aluminum, tungsten, etc., on the second silicon oxide layer 50*a* by utilizing a common sputtering method. Metal patterns 52 having widths of about 6,600 Å, and gaps of about 8,400 Å were formed by patterning the metal layer utilizing a photolithography process. Next, a third SOG layer 54 having a weight average molecular weight of the perhydropolysilazane was 4,500 to 7,500, a thickness range of about 3,800 to about 4,500 Å, and completely covering the metal patterns 52, was formed by spin coating the SOG solution.

Figure 2K:
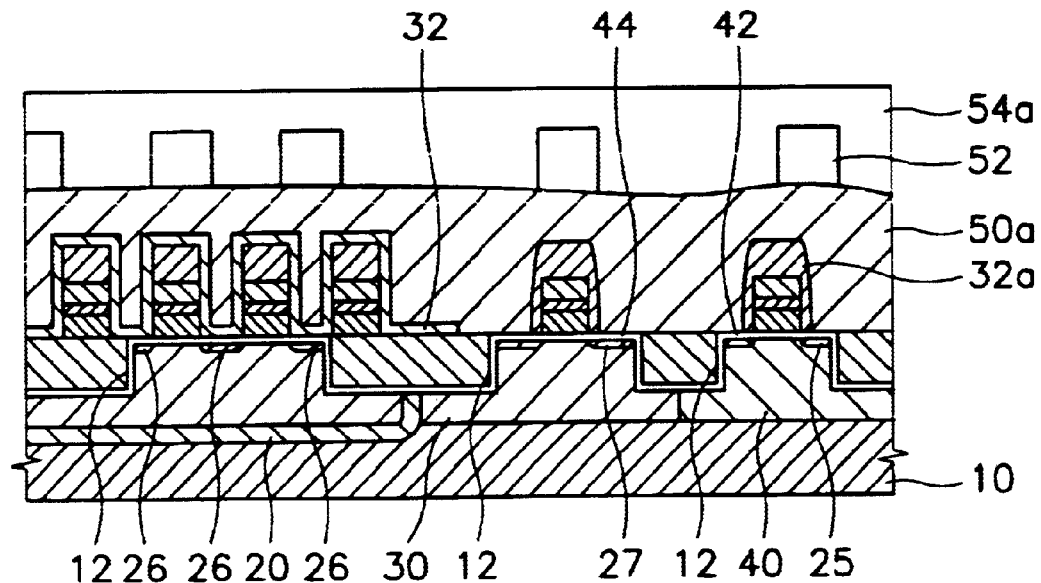

Referring to FIGS. 2J and 2K, the third SOG layer 54 was pre-baked at a temperature within the range from about 100 to 500° C. for about 1–5 minutes, and then main-baked at a temperature within the range of about 400 to 450° C. for about 10–180 minutes. The main baking was conducted under a water vapor atmosphere. Then, Si—N bonds in the third SOG layer 54 were substituted with Si—O bonds through the curing process, and in accordance with an important aspect of the invention, the third SOG layer 54 was converted into a third silicon oxide layer 54a having a substantially planar surface.

A semiconductor device was manufactured by implementing a conventional semiconductor manufacturing process. Skilled artisans are capable of manufacturing a semiconductor device using the SOG composition and method of the various embodiments of the invention.

Light Absorbance of a Silicon Oxide Layer

An oxide layer was formed on a semiconductor substrate by the method described above with reference to FIGS. 2A–2K. The oxide layer was formed on a semiconductor substrate having a plurality of wiring layers having an aspect ratio within the range of about 5:1 to 10:1, and a gap between them within the range of about 0.04 to 1 $\mu$m. A silicon nitride layer having a thickness of about 400 Å was formed to cover the plurality of wiring layers and the semiconductor substrate.

A second SOG layer having a thickness of about 7,582 Å was formed by spin coating an SOG solution including perhydropolysilazane onto the semiconductor substrate. At this time, the rotational speed was controlled to about 1,000 rpm.

The second SOG layer was pre-baked at 150° C. for 3 minutes. After the pre-baking the light absorbance of the SOG layer was detected by utilizing an FT-IR method. Skilled artisans are capable of using the FT-IR method to determine the light absorbance of the SOG layer. FIG. 3 is an FT-IR diagram showing the light absorbance of a layer obtained after pre-baking the SOG layer. As shown in FIG. 3, light absorbing peaks are illustrated at some wavelength regions that represent bonds of N—H, Si—H, Si—N, etc. after the pre-baking. At this time, the stress value was about $3.63 \times 10^8$ (dyne/cm$^2$), and was detected with a stress gauge.

Figure 4:
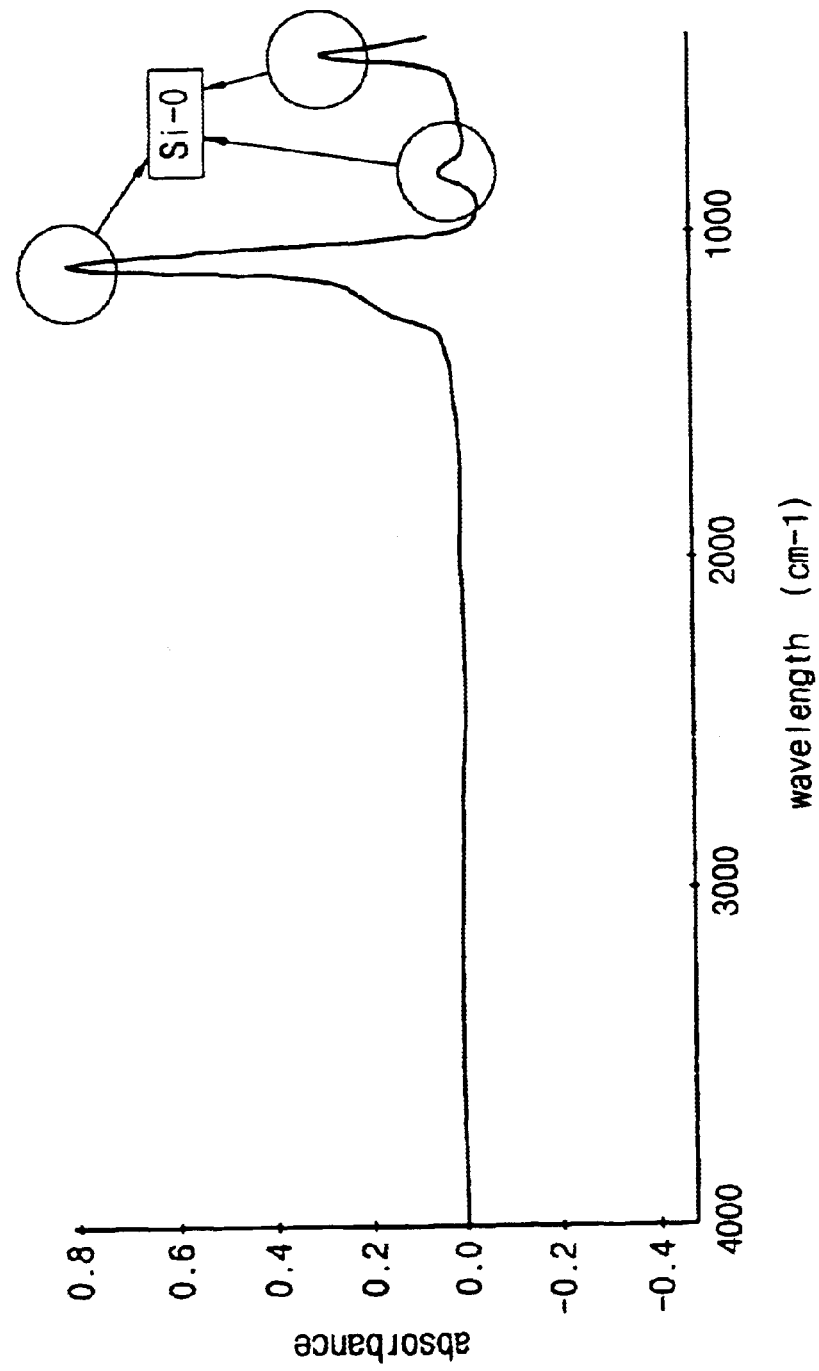
FIG. 4 is an FT-IR diagram showing the light absorbance of a silicon oxide layer detected after main baking an SOG layer.

After the pre-baking, the SOG layer was baked again (main baking) at 700° C. for 30 minutes to convert the SOG layer into a silicon oxide layer. FIG. 4 is an FT-IR diagram illustrating the light absorbance of the silicon oxide layer detected after the main baking. As shown in FIG. 4, the peaks of wavelength regions corresponding only to Si—O bonds remain after the main baking At this time, the stress value was $-1.22 \times 10^8$ (dyne/cm$^2$). From FIG. 4, it follows that all of the Si—N bonds in the SOG layer were converted into Si—O bonds. Accordingly, the SOG layer was completely converted into a silicon oxide layer.

In addition, no voids were observed in the silicon oxide layer formed on the semiconductor substrate having a plurality of wiring patterns. The plurality of wiring patterns had an aspect ratio within the range of about 5:1 to 10:1, and a gap within the range of about 0.04 to 1 $\mu$m.

Detecting an Etching Rate of Silicon Oxide

A. Forming a Silicon Oxide Layer Utilizing SOG

An SOG solution was coated onto a bare wafer to form an SOG layer. The SOG solution of the present invention was coated by a spin coating method whereby the rotational velocity of the wafer was about 1,000 rpm. The SOG layer was deposited to a thickness of about 7,500 to about 8,200 Å. Next, the SOG layer was pre-baked at about 150° C. for 3 minutes, and then main-baked at about 700° C. for 30 minutes. The main baking was conducted under a water vapor atmosphere whereby the content of water vapor in this atmosphere was in the range of about 1.2–86% by weight. Si—N bonds in the SOG layer were converted with Si—O bonds during the curing process and the SOG layer was converted to a silicon oxide layer. The thickness of the thus formed silicon oxide layer was about 6,400 Å.

B. Forming an Oxide Layer by a CVD Method

A high density plasma (HDP) CVD-oxide layer was formed on a bare wafer by utilizing silane gas and oxygen as a source gas, and argon gas as a carrier gas to be used as a standard. The thickness of thus formed CVD-oxide layer was about 6,000 Å.

C. Detecting the Wet Etching Rate

The silicon oxide layer formed by the method of the present invention and the CVD-oxide layer formed by the CVD method were respectively etched. The respective wet etching processes were conducted by using the same etching solution for a constant period of time, and etching rate was detected at a constant time interval. The results are illustrated in FIGS. 5A–5F.

Figure 5A:
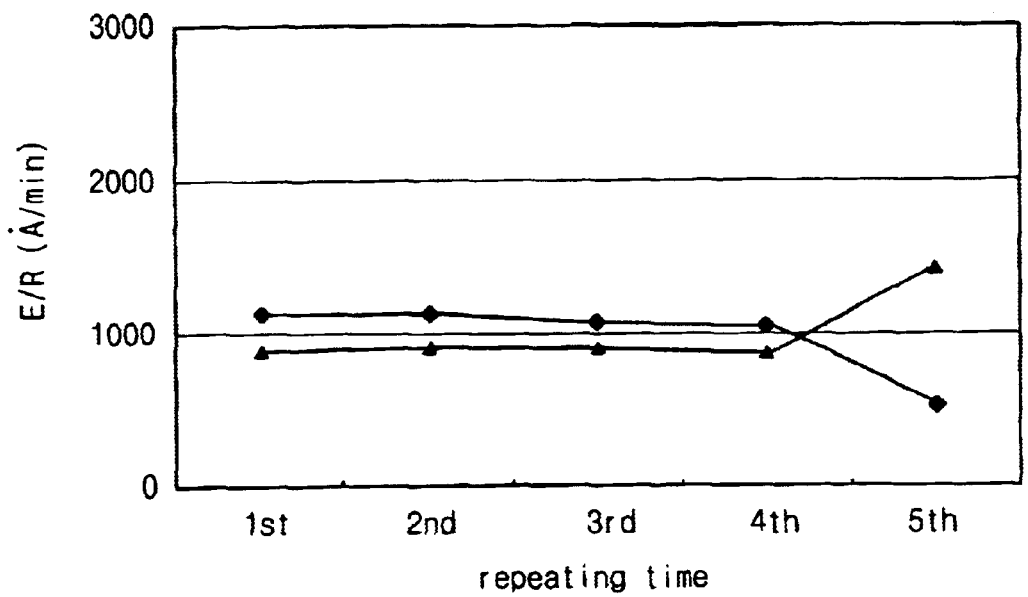
FIGS. 5A–5G are graphs illustrating etching ratios of silicon oxide layers according to embodiments of the present invention, and the etching ratios of silicon oxide layers formed by a conventional CVD method.

FIG. 5A represents curves illustrating the etching rates detected at a time interval of 1 minute for the oxide layer formed by a method of the present invention and the oxide layer formed by the CVD method. Wet etching was carried out in a solution obtained by diluting a buffer etching solution including ammonium fluoride into distilled water (NH$_4$F and HF diluted in distilled water) at room temperature (25° C.).

Figure 5B:
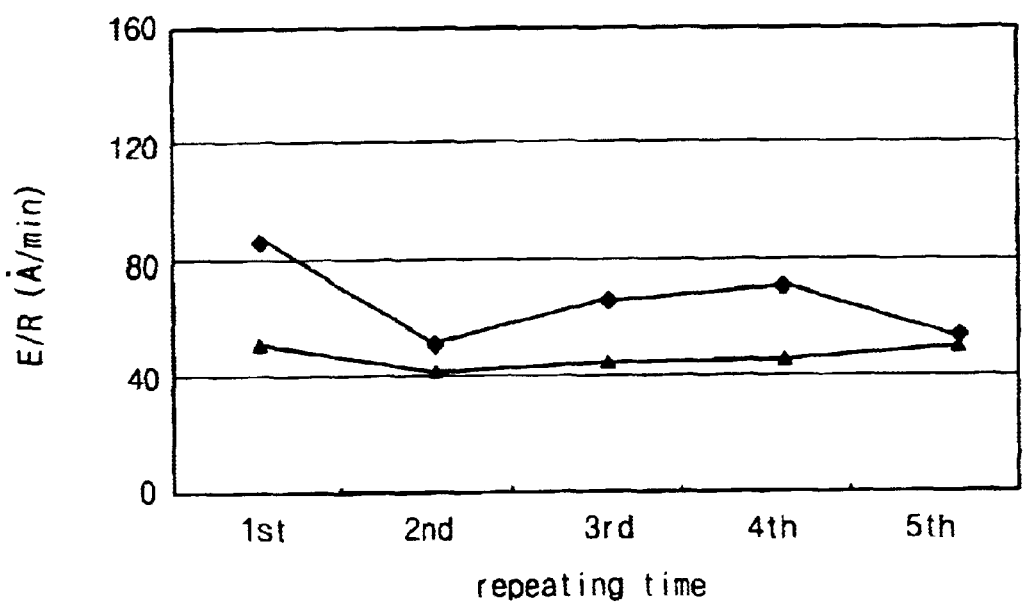

FIG. 5B represents curves illustrating the etching rates detected at a time interval of 1 minute for the oxide layer formed by a method of the present invention and the oxide layer formed by the CVD method. Wet etching was carried out in an aqueous solution of diluted hydrofluoric acid (DI:HF=100:1) at room temperature (25° C.).

Figure 5C:
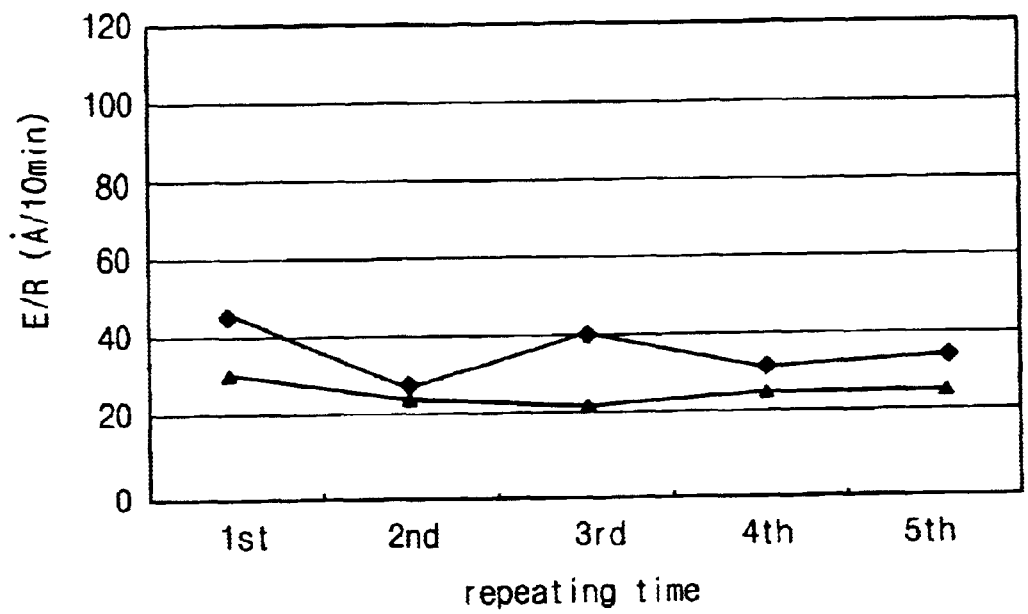

FIG. 5C represents curves illustrating the etching rates detected at a time internal of ten minutes for the oxide layer formed by a method of the present invention and the oxide layer formed by the CVD method. Wet etching was carried out in a mixed etching solution of NH$_4$OH:H$_2$O$_2$:H$_2$O in a ratio of 0.25:1:5 at 70° C.

Figure 5D:
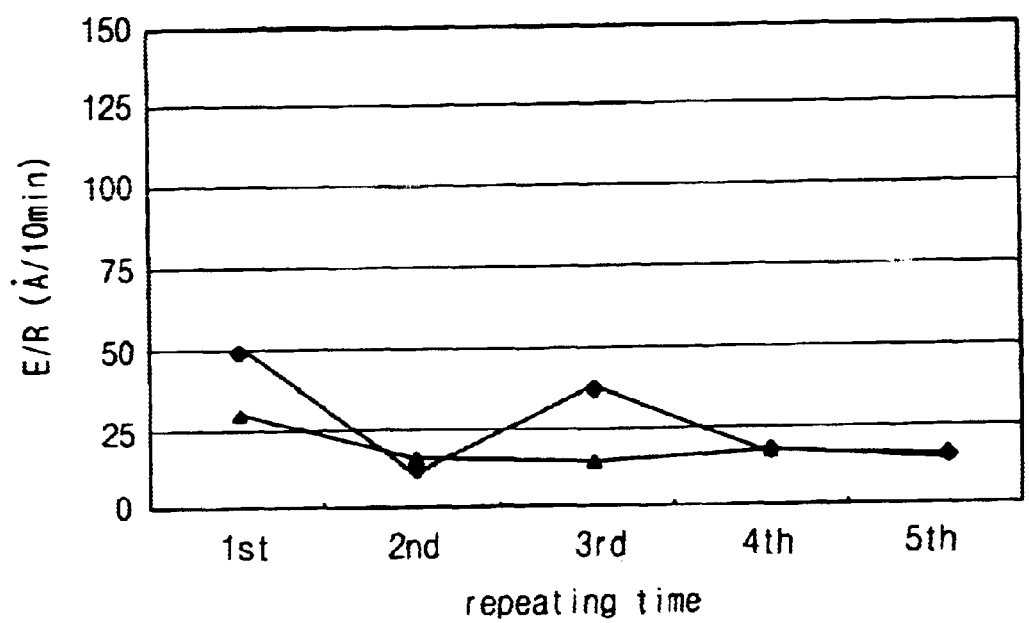

FIG. 5D represents curves illustrating the etching rates detected at a time interval of ten minutes for the oxide layer formed by a method of the present invention and the oxide layer formed by the CVD method. Wet etching was carried out in phosphoric acid at 165° C.

Figure 5E:
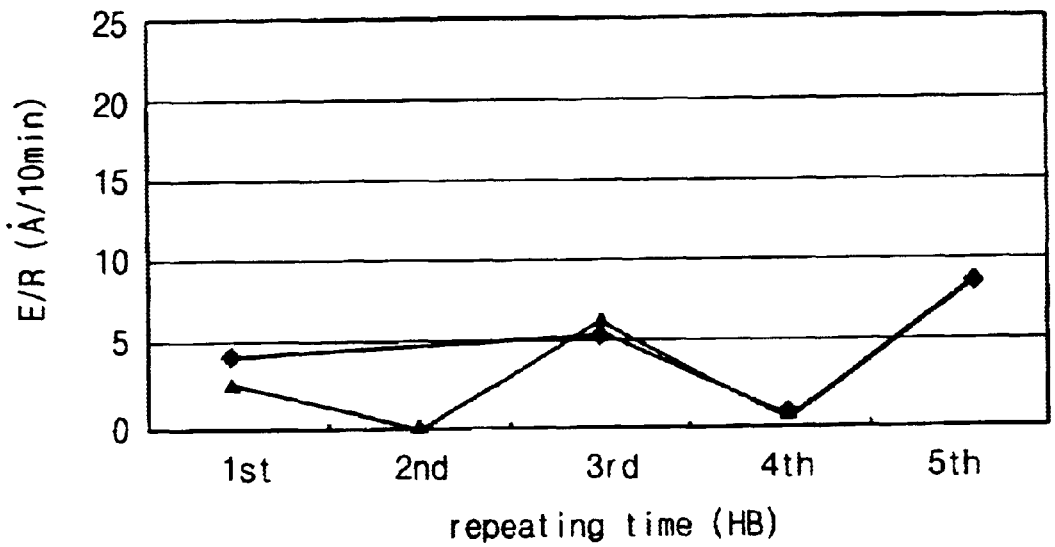

FIG. 5E represents curves illustrating the etching rates detected at a time interval of ten minutes for the oxide layer formed by a method of the present invention and the oxide layer formed by the CVD method. Wet etching was carried out in a mixed etching solution of H$_2$SO$_4$:H$_2$O$_2$ in a ratio of 6:1 at 130° C.

Figure 5F:
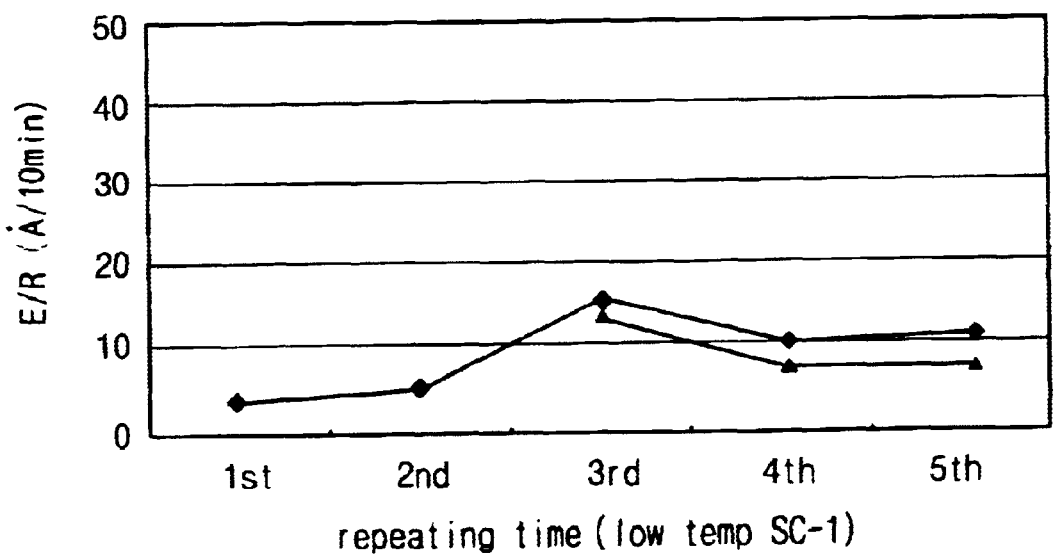

FIG. 5F represents curves illustrating the etching rates detected at a time interval of ten minutes for the oxide layer formed by a method of the present invention and the oxide layer formed by the CVD method. Wet etching was carried out in a mixed etching solution of NH$_4$OH:H$_2$0$_2$:H$_2$O in a ratio of 0.25:1:5 at 50° C.

D. Detecting the Dry Etching Rate

Figure 5G:
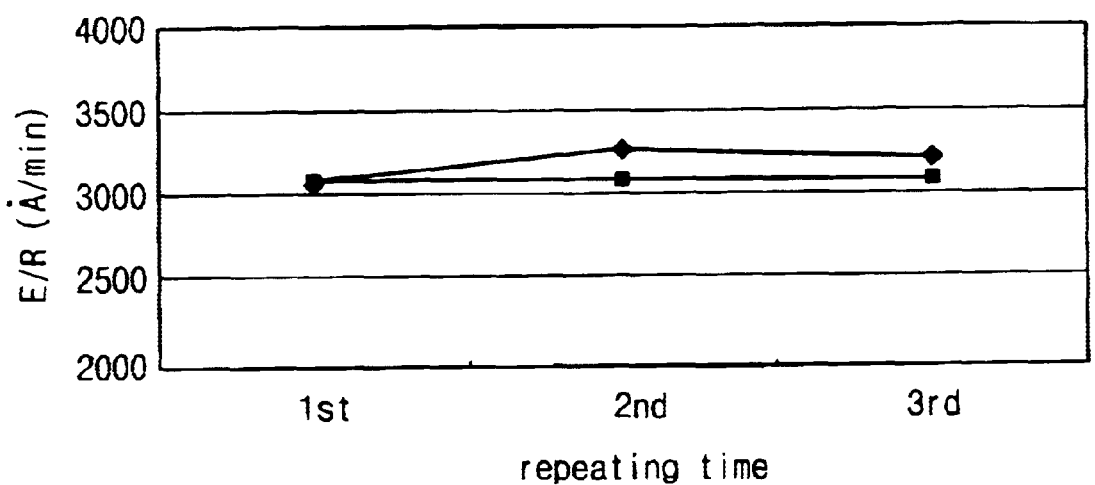

The oxide layer formed by the method of the present invention and the oxide layer formed by the CVD method were introduced into the same chamber and the etching rates were repeatedly detected by utilizing the same etching gas. The pressure in the chamber was controlled to 30 mTorr and the output power in the chamber was 1,700 W. The etching gas utilized was C$_5$F$_8$:C$_4$F$_8$:O$_2$:Ar in flowing rates of 8 sccm, 4 sccm, 6 sccm and 500 sccm, respectively. The detected etching rates are illustrated as graphs in FIG. 5G.

From FIGS. 5A–5G, it can be noted that the wet and dry etching rates of the silicon oxide layer formed by the present invention were quite similar to the wet and dry etching rates of the silicon oxide layer formed by the conventional CVD method. Accordingly, a planarized layer or an inter insulation layer formed by utilizing the SOG layer according to the present invention has properties similar to the conventional CVD-oxide layer.

Through repeated experiments by the present inventors, a silicon oxide layer free from voids can be formed on a semiconductor substrate having wiring layers that have an aspect ratio within the range of about 5:1 to 10:1, and a gap within the range of about 0.04 to 1 μm. Such a silicon oxide layer can be formed by utilizing the SOG composition of the present invention. According to the present invention, a silicon oxide layer free from voids with a planarity required for 256 megabit devises can be formed by utilizing the SOG of the present invention.

While embodiments of the present invention are described in detail with reference to particularly preferred examples, various modifications, alternate constructions and equivalents may be employed without departing from the true spirit and scope of the present invention.

What is claimed is:

1. A method of forming a silicon oxide layer comprising:
   providing a semiconductor substrate having a stepped portion;
   coating the semiconductor substrate with a spin-on glass (SOG) composition containing perhydropolysilazane having the compound formula —$(SiH_2NH)_n$— wherein n represents a positive integer, a weight average molecular weight within the range of from about 4,000 to about 8,000, a molecular weight dispersion within the range of about 3.0 to about 4.0; and
   curing the SOG layer to form a layer of silicon oxide having a planar surface,
   wherein the stepped portion is formed by:
      partially etching an upper portion of the semiconductor substrate to form a trench; and
   the silicon oxide layer is formed by:
      coating the SOG composition on the substrate to fill the trench and to form an SOG layer; and
      curing the SOG layer by:
         pre-baking the SOG layer at a temperature within the range of from about 100 to about 500° C. for a first period of time; and
         main-baking the SOG layer at a temperature within the range of about 900 to about 1000° C. for a second period of time.

2. The method as claimed in claim 1, wherein the weight average molecular weight of the perhydropolysilazane of the SOG composition is about 6000–8000.

3. A method of forming a silicon oxide layer comprising:
   providing a semiconductor substrate having a stepped portion;
   coating the semiconductor substrate with a spin-on glass (SOG) composition containing perhydropolysilazane having the compound formula —$(SiH_2NH)_n$— wherein n represents n positive integer, a weight average molecular weight within the range of from about 4,000 to about 8,000, a molecular weight dispersion within the range of about 3.0 to about 4.0; and
   curing the SOG layer to form a layer of silicon oxide having a planar surface,
   wherein the stepped portion is formed by:
      forming a plurality of gate electrodes on the semiconductor substrate;
   and the silicon oxide layer is formed by:
      coating the SOG composition on the substrate to completely cover the plurality of gate electrodes and to form an SOG layer; and
      curing the SOG layer by:
         pre-baking the SOG layer at a temperature within the range of from about 100 to about 500° C. for a first period of time; and
         main-baking the SOG layer at a temperature within the range of about 600 to about 900° C. for a second period of time.

4. The method as claimed in claim 3, wherein the weight average molecular weight of the perhydropolysilazane of the SOG composition is about 4000–6000.

5. A method of forming a silicon oxide layer comprising:
   providing a semiconductor substrate having a stopped portion;
   coating the semiconductor substrate with a spin-on glass (SOG) composition containing perhydropolysilazane having the compound formula —$(Si_2NH)_n$— wherein n represents a positive integer, a weight average molecular weight within the range of from about 4,000 to about 8,000, a molecular weight dispersion within the range of about 3.0 to about 4.0; and
   curing the SOG layer to form a layer of silicon oxide having a planar surface,
   wherein the stepped portion is formed by:
      forming an insulation layer on the semiconductor substrate; and
      forming a plurality of metal wiring patterns on the insulation layer;
   and the silicon oxide layer is formed by:
      coating the SOG composition on the substrate to completely cover the metal wiring patterns thereby to form an SOG layer; and
      curing the SOG layer by:
         pre-baking the SOG layer at a temperature within the range of from about 100 to about 500° C. for a first period of time; and
         main-baking the SOG layer at a temperature within the range of about 400 to about 450° C. for a second period of time.

6. The method as claimed in claim 5, wherein the weight average molecular weight of the perhydropolysilazane of the SOG composition is about 4500–7500.

* * * * *